(12) United States Patent
Slessman

(10) Patent No.: US 8,888,158 B2
(45) Date of Patent: Nov. 18, 2014

(54) SYSTEM AND METHOD OF PROVIDING COMPUTER RESOURCES

(71) Applicant: IO Data Centers, LLC, Phoenix, AZ (US)

(72) Inventor: George Slessman, Phoenix, AZ (US)

(73) Assignee: IO Data Centers, LLC, Phoenix, AZ (US)

( * ) Notice: Subject to any disclaimer, the term of this patent is extended or adjusted under 35 U.S.C. 154(b) by 0 days.

(21) Appl. No.: 13/857,916

(22) Filed: Apr. 5, 2013

(65) Prior Publication Data

US 2014/0103678 A1 Apr. 17, 2014

Related U.S. Application Data

(63) Continuation of application No. 12/626,278, filed on Nov. 25, 2009, now Pat. No. 8,434,804.

(60) Provisional application No. 61/119,980, filed on Dec. 4, 2008.

(51) Int. Cl.
| | |
|---|---|
| *B60P 3/00* | (2006.01) |
| *H05K 7/14* | (2006.01) |
| *H05K 7/20* | (2006.01) |
| *F28F 9/02* | (2006.01) |

(52) U.S. Cl.
CPC .......... *H05K 7/1497* (2013.01); *H05K 7/20745* (2013.01); *H05K 7/20836* (2013.01); *F28F 9/028* (2013.01); *F28F 9/0265* (2013.01)
USPC ........................................... 296/24.3

(58) Field of Classification Search
USPC ................ 296/65.03, 64, 65.01, 353, 378.12, 296/378.13; 297/313, 353, 378.12, 378.13; 414/921
See application file for complete search history.

(56) References Cited

U.S. PATENT DOCUMENTS

| | | | | |
|---|---|---|---|---|
| 6,462,944 | B1 * | 10/2002 | Lin ............................. | 361/679.5 |
| 6,742,583 | B2 * | 6/2004 | Tikka ............................ | 165/291 |
| 7,500,911 | B2 * | 3/2009 | Johnson et al. ............... | 454/184 |
| 7,534,167 | B2 * | 5/2009 | Day ............................. | 454/187 |
| 7,643,291 | B2 * | 1/2010 | Mallia et al. .................. | 361/695 |
| 7,724,518 | B1 * | 5/2010 | Carlson et al. ........... | 361/679.53 |
| 7,738,251 | B2 * | 6/2010 | Clidaras et al. ............... | 361/701 |
| 7,856,838 | B2 * | 12/2010 | Hillis et al. .................. | 62/259.2 |
| 7,867,070 | B2 * | 1/2011 | Day ............................. | 454/184 |
| 7,878,889 | B2 * | 2/2011 | Day ............................. | 454/184 |
| 7,894,945 | B2 * | 2/2011 | Hillis ............................ | 700/276 |
| 8,051,672 | B2 * | 11/2011 | Mallia et al. ................. | 62/259.2 |

(Continued)

OTHER PUBLICATIONS

Supplementary Extended European Search Report, Application No. EP 09 831 226.7, European Search Authority, April 18, 2013, 8 pages.

*Primary Examiner* — Kiran B Patel

(57) ABSTRACT

A data center system can include a mobile support structure; one or more enclosures for removable electronic equipment where the enclosures are housed by the support structure; a cooling system in fluid communication with the enclosures for cooling of the electronic equipment where the cooling system is housed by the support structure; and a power system operably connected to the electronic equipment and the cooling system for supplying power thereto where the power system comprises a generator housed by the support system. The mobile data center can be moved to remote locations, and the electronic equipment can be placed in communication with a network when at the remote location. Other embodiments are disclosed.

16 Claims, 15 Drawing Sheets

(56) References Cited

U.S. PATENT DOCUMENTS

| | | |
|---|---|---|
| 8,157,626 B2 * | 4/2012 | Day .............................. 454/39 |
| 8,218,322 B2 * | 7/2012 | Clidaras et al. ............... 361/701 |
| 8,355,246 B2 * | 1/2013 | Linhares et al. ......... 361/679.46 |
| 8,498,114 B2 * | 7/2013 | Martini ......................... 361/695 |
| 2002/0059804 A1 | 5/2002 | Spinazzola et al. |
| 2006/0082263 A1 | 4/2006 | Rimler et al. |
| 2007/0025271 A1 | 2/2007 | Niedrich et al. |
| 2008/0123288 A1 | 5/2008 | Hillis |

* cited by examiner

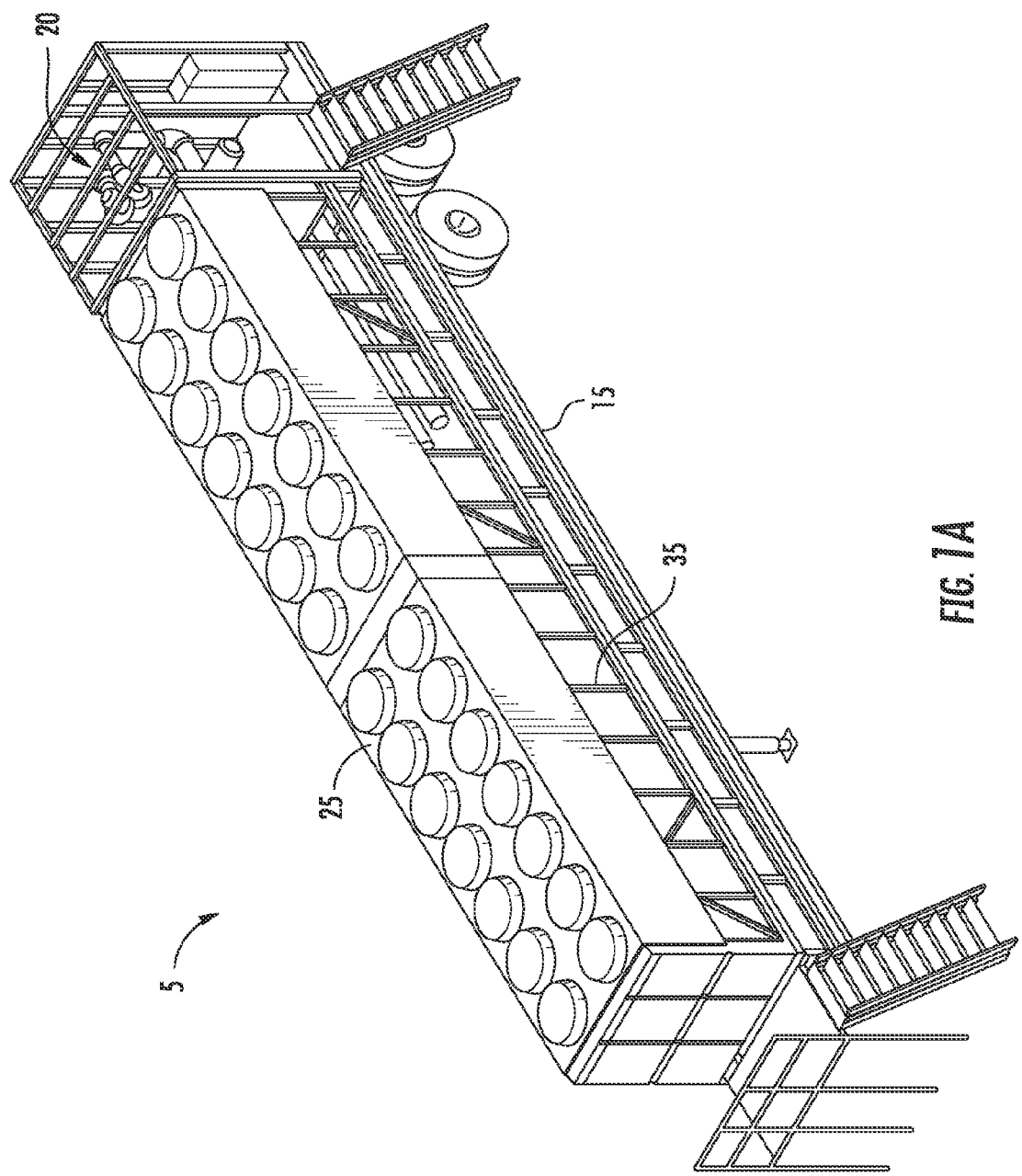

SYSTEM AND METHOD OF PROVIDING COMPUTER RESOURCES

CROSS-REFERENCES TO RELATED APPLICATIONS

This application claims priority to and the benefit of U.S. patent application Ser. No. 12/626,278 filed on Nov. 25, 2009. The '278 application is a non-provisional application of U.S. Provisional Patent application Ser. No. 61/119,980 filed on Dec. 4, 2008, the disclosure of which is hereby incorporated by reference.

The '278 application is related to co-pending U.S. patent application Ser. No. 12/626,299 entitled "Apparatus and Method of Environmental Condition Management for Electronic Equipment" and filed Nov. 25, 2009, the disclosure of which is hereby incorporated by reference.

FIELD OF THE INVENTION

The present application relates to providing computer resources, and particularly to a system and method for achieving the desired environmental conditions for servers and other computing devices.

BACKGROUND

Data centers are facilities for housing electronic equipment, such as servers. A data center can occupy one room of a building, one or more floors, or an entire building. These facilities often have a large footprint due to the various components necessary for maintaining the facilities, including cooling equipment. Most of the equipment is often in the form of servers mounted in 19 inch rack cabinets, which are typically placed in single rows forming corridors between them. This allows people access to the front and rear of each cabinet. Servers differ greatly in size from 1 U servers to large free-standing storage silos which occupy many tiles on the floor. Some electronic equipment, such as mainframe computers and storage devices, are often as big as the racks themselves, and are placed alongside them. Local building codes can affect the footprint of the facility and thus the overall cost of maintaining the electronic equipment.

Cooling of server racks and cabinets in the facilities can be problematic, particularly as processors typically produce large amounts of heat. It has been found that for every 1 watt of power used for Information Technology, 0.5 to 2 watts of power are used for cooling the electronic components, and thus the need for cooling uses a very high percentage of the total IT power consumption.

The power dissipation of high-performance CPU processors is predicted to exceed 150 W in the near future. The high-density packing of servers and the desire for lower CPU junction temperatures to achieve higher reliability of components means that thermal management of server racks is an increasing concern. Various solutions have been proposed, many of which involve large numbers of fans to keep a constant airflow over the electronic components. However, such solutions suffer from drawbacks associated with the power supply needed to power the fans, as well as reliability of such fans. Moreover, these are generally located in large facilities which further exacerbates the drawbacks.

In a number of solutions, server cabinets are placed on a false floor with cool air from an HVAC system being supplied through the false floor to a vent in front of the cabinet. The cooling airflow is then drawn front-to-back through the cabinet using fans, and vented out to the back of the cabinet. With such arrangements, it is desirable to use a "hot-aisle/cold-aisle" arrangement so that server fronts are arranged facing one another so that two aisles can draw cool air from a single vent area, and so that the server backs also face one another. The hot air is then allowed to vent to air return units in the ceiling. This can lead to "hot spots" in the server room; however, much of the hot air can also mix with the cool air circulating in the room. Various solutions to such problems involve the use of baffles extending from the top of the server cabinet to the ceiling to try to prevent some of the mixing between the hot and cold air.

The maximum allowed temperature range for a server in a data center is typically 59 to 90 degrees Fahrenheit, while the recommended temperature is typically between 68 and 77 degrees Fahrenheit. As the known data center storage solutions typically allow some mixing of air prior to the air reaching the electronic components, data centers typically pump cold air at between 55 and 60 degrees Fahrenheit to account for the temperature increase in the air before it can act to cool the components.

SUMMARY

In accordance with one aspect of the exemplary embodiments, a data center system can include a mobile support structure; one or more enclosures for removable electronic equipment where the enclosures are housed by the support structure; a cooling system in fluid communication with the enclosures for cooling of the electronic equipment where the cooling system is housed by the support structure; and a power system operably connected to the electronic equipment and the cooling system for supplying power thereto where the power system comprises a generator housed by the support structure. The mobile data center is capable of being moved to remote locations, and the electronic equipment is capable of being placed in communication with a network when at the remote location.

In accordance with another aspect of the exemplary embodiments, a data center system is provided that can include a mobile support structure; a plurality of cabinets that each form an enclosure for removable electronic equipment where the cabinets are housed by the support structure; and a cooling system in fluid communication with an inner volume of each of the cabinets for cooling of the electronic equipment where the cooling system is housed by the support structure. The mobile data center is capable of being moved to remote locations, and the electronic equipment is capable of being placed in communication with a network when at the remote location.

In accordance with another exemplary embodiment, a data center system can include: a mobile support structure having wheels and capable of being moved to a remote location; one or more cabinets forming enclosures for removable servers where the cabinets are housed by the support structure; a cooling system in fluid communication with the cabinets for cooling of the servers where the cooling system is housed by the support structure, where the cooling system comprises an air supply channel, a cooling coil and a chiller, where the cooling coil is in fluid communication with the chiller, where the air supply channel provides air flow into the cabinet enclosures, where the cooling coil is in thermal contact with the air supply channel and where a coolant flows through the cooling coil to remove heat from the air flowing through the air supply channel; and a control system comprising one or more sensors and a controller, where the sensors are in proximity to the cabinets for monitoring at least one of a temperature, pressure and humidity associated with the servers, and where the controller is in communication with the sensors for receiving data from the sensors, where the controller adjusts at least one of the temperature, the pressure and the humidity associated with the servers, and where the servers are capable of being placed in communication with a network when at the remote location.

In accordance with another exemplary embodiment, a method can include, but is not limited to, the steps of: providing a mobile support structure having wheels and capable of being moved to a remote location; installing servers in cabinets that are housed by the mobile support structure; moving the mobile support structure to the remote location; connecting the servers with a network when at the remote location; and maintaining at least one of a temperature, a pressure and a humidity associated with the servers within a desired range.

The above-described and other features and advantages of the present disclosure will be appreciated and understood by those skilled in the art from the following detailed description, drawings, and appended claims.

BRIEF DESCRIPTION OF THE DRAWINGS

FIG. 1A is a perspective schematic view of a mobile data center according to arrangements of the present invention.

DETAILED DESCRIPTION OF THE INVENTION

The exemplary embodiments of the present disclosure are described with respect to an environmental management system for electronic equipment. It should be understood by one of ordinary skill in the art that the exemplary embodiments of the present disclosure can be applied to other types of management systems.

Figure 1B:
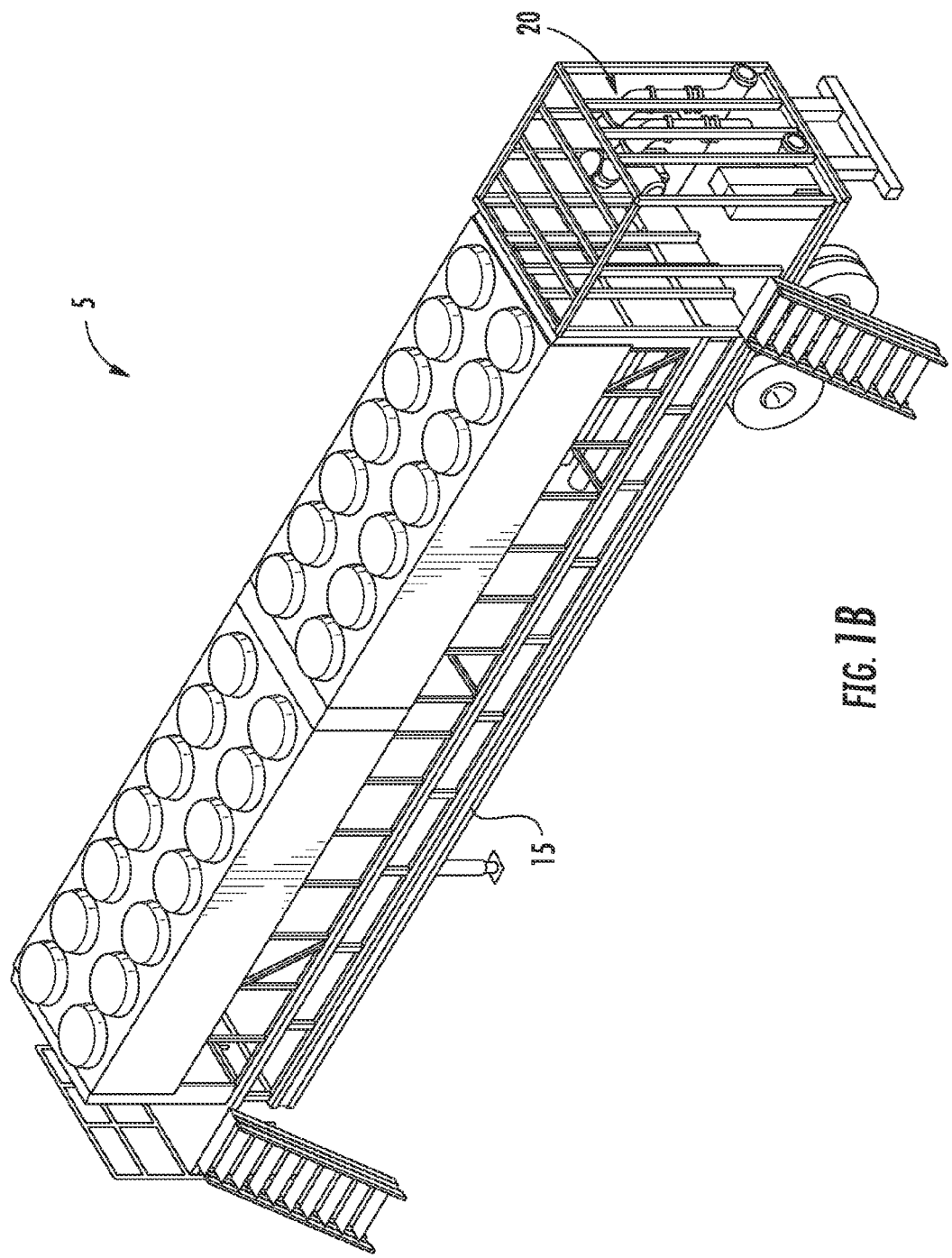
FIG. 1B is another perspective schematic view of a mobile data center.

Referring to the drawings and in particular FIGS. 1A and 1B, an exemplary mobile data center system 5 is illustrated. The system 5 can include a support structure 15 which is capable of being moved to various locations, including remote locations, and then connected to a network at the new location, such as through a hardwire link, for providing computer resources. In one embodiment, the support structure 15 can be a trailer with wheels that is capable of being towed. In another embodiment, the support structure 15 can be a self-contained moving vehicle; i.e., a drivable vehicle.

The system 5 can include a power sub-system having generator 20 that provides power to electronic equipment, such as servers, as well as other sub-systems, including a cooling system and a control system. In one embodiment, the generator 20 can be a self-contained power generating device, such as a diesel generator. However, the present disclosure contemplates the use of other power supply devices, which may or may not be connectable with outside power supply sources, such as the power grid at the remote location. For example, the power sub-system can be connectable with the power grid for receiving additional power as needed. Other power supply sources that can be used to supplement or otherwise provide energy to system 5, can include solar power sources, wind power sources, hydrogen power sources and so forth.

Figure 1C:
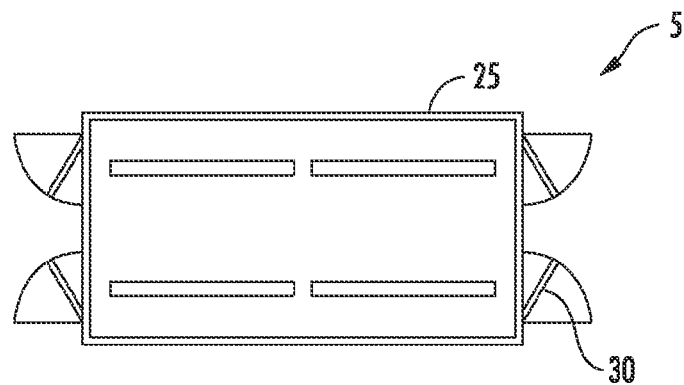
FIG. 1C is a top schematic illustration of a housing of a mobile data center.
Figure 1D:
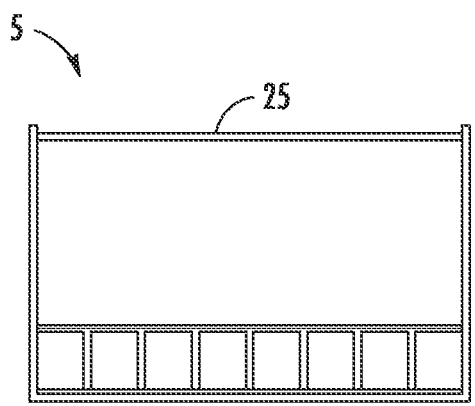
FIG. 1D is a side schematic illustration of a housing of a mobile data center.
Figure 1E:
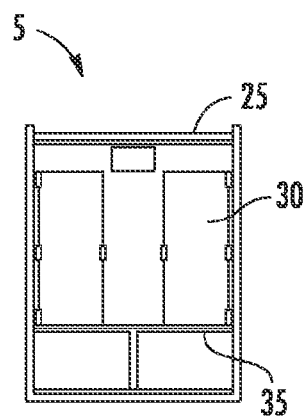
FIG. 1E is a front schematic illustration of a housing of a mobile data center.
Figure 1G:
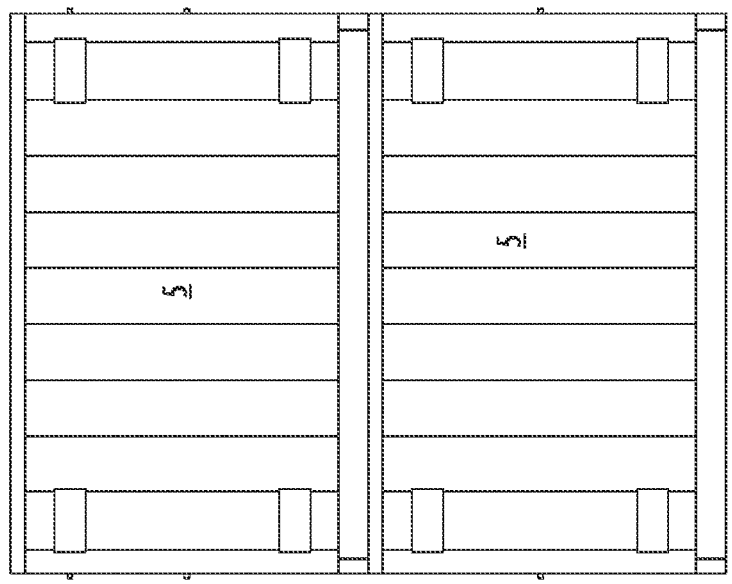
FIGS. 1F-I are schematic illustrations of a housing configuration of a mobile data center.
Figure 1I:
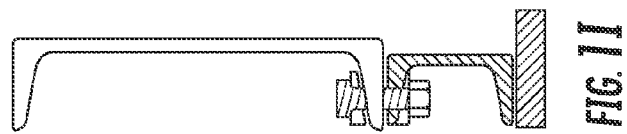
Figure 1H:
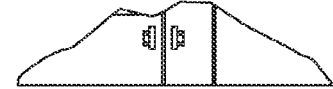
Figure 1F:
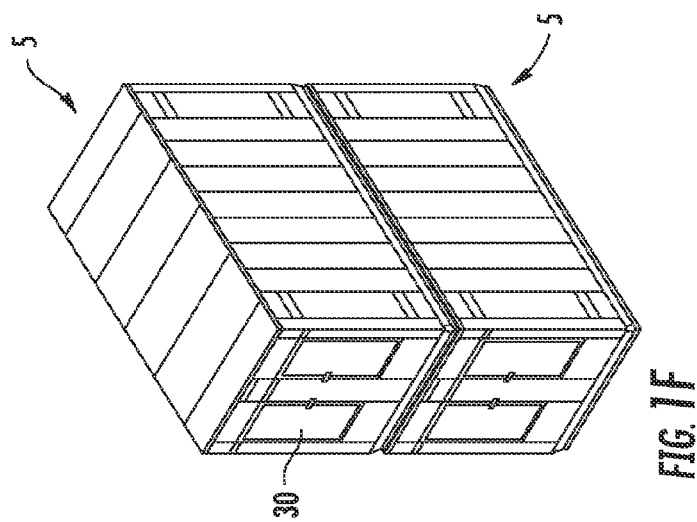
Figure 1J:
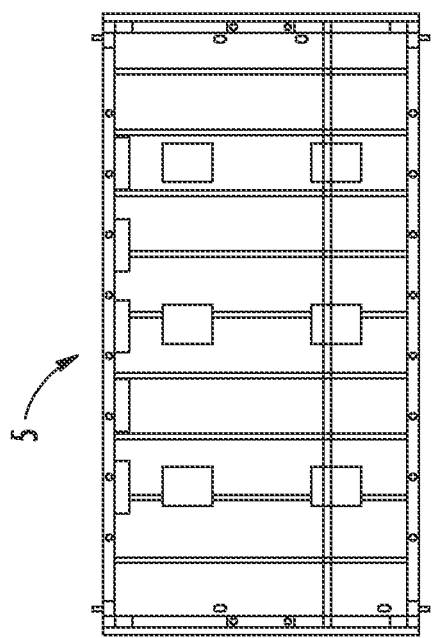
FIGS. 1J-L are schematic illustrations of the housing of FIG. 1C.
Figure 1L:
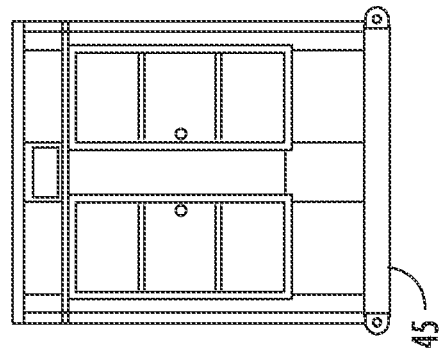
Figure 1K:
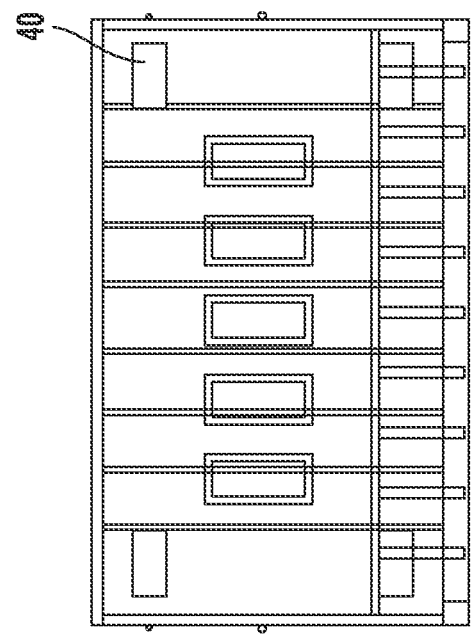

Referring additionally to FIGS. 1C-E, in one embodiment, the system 5 can comprise one or more housings 25 for the electronic equipment, which may have various points of access including rear and top parts or doors. In one embodiment, doors 30 can provide access to the inner volume of the housings 25 which can have a raised floor 35, such as a platform with bar gratings. The raised floor 35 can provide access for electrical wiring, cooling conduit and the like to individual cabinets that house the servers. The housings 25 can be configured in various ways including coaxially, such as in FIG. 1A or stacked on each other as in FIGS. 1F-I. In another embodiment, the housing 25 can be formed using thermally insulated walls, including a non-perforated liner. Referring additionally to FIGS. 1J-L, the housing 25 can include a number of access panels 40. A lifting structure 45, such as a lift lug, can be provided to facilitate positioning of the housing 25 with respect to the support structure 15.

The electronic equipment can be positioned in a plurality of cabinets 10 (shown in FIG. 2) such as arranged in rows with access to the rows being provided by the doors 30, although the present disclosure also contemplates other configurations for the cabinets. The particular configuration of the rows can be selected based on a number of factors, including facilitating adjustment of environmental conditions associated with the cabinets and/or maximizing facility space.

In one embodiment, different housings 25 can have different required environmental conditions. For example, a first housing 25 can include cabinets 10 that are housing servers, which require a large amount of cooling while a second housing includes cabinets housing routers that require a smaller amount of cooling. By grouping the cabinets according to environmental requirements (e.g., desired temperature and humidity ranges), system 5 can more efficiently control the environments associated with the particular electronic equipment.

As described above, system 5 can include a cooling subsystem for delivery of a cooling fluid to each of the cabinets. The particular configuration of the cooling system, including the positioning of the various components, such as a chiller, conduits, fans and so forth, can vary. In one embodiment, the cooling fluid can comprise air, such as delivered through the use of pressurized plenums. The particular conduit configuration for delivery of the air to the cabinets 10 can vary. For example, an air supply channel can supply cooling air to multiple cabinets and/or multiple rows of cabinets. In one embodiment, each cabinet can be connected directly to an air supply channel so that each cabinet receives air that flows directly from the cooling subsystem rather than from another cabinet. In another embodiment, the cabinets 10 can be arranged or grouped so that a portion of the cabinets receive cooling in series. For example, a first group of cabinets 10 requiring a large amount of cooling can directly receive air that has been cooled by the cooling subsystem. This cold air can flow across the electronic equipment of the first group of cabinets 10 and then can be directed towards a second group of cabinets that require a smaller amount of cooling. The air can then be returned to the cooling subsystem for removal of the heat that has been transferred to the air by the first and second groups of cabinets.

Figure 2:
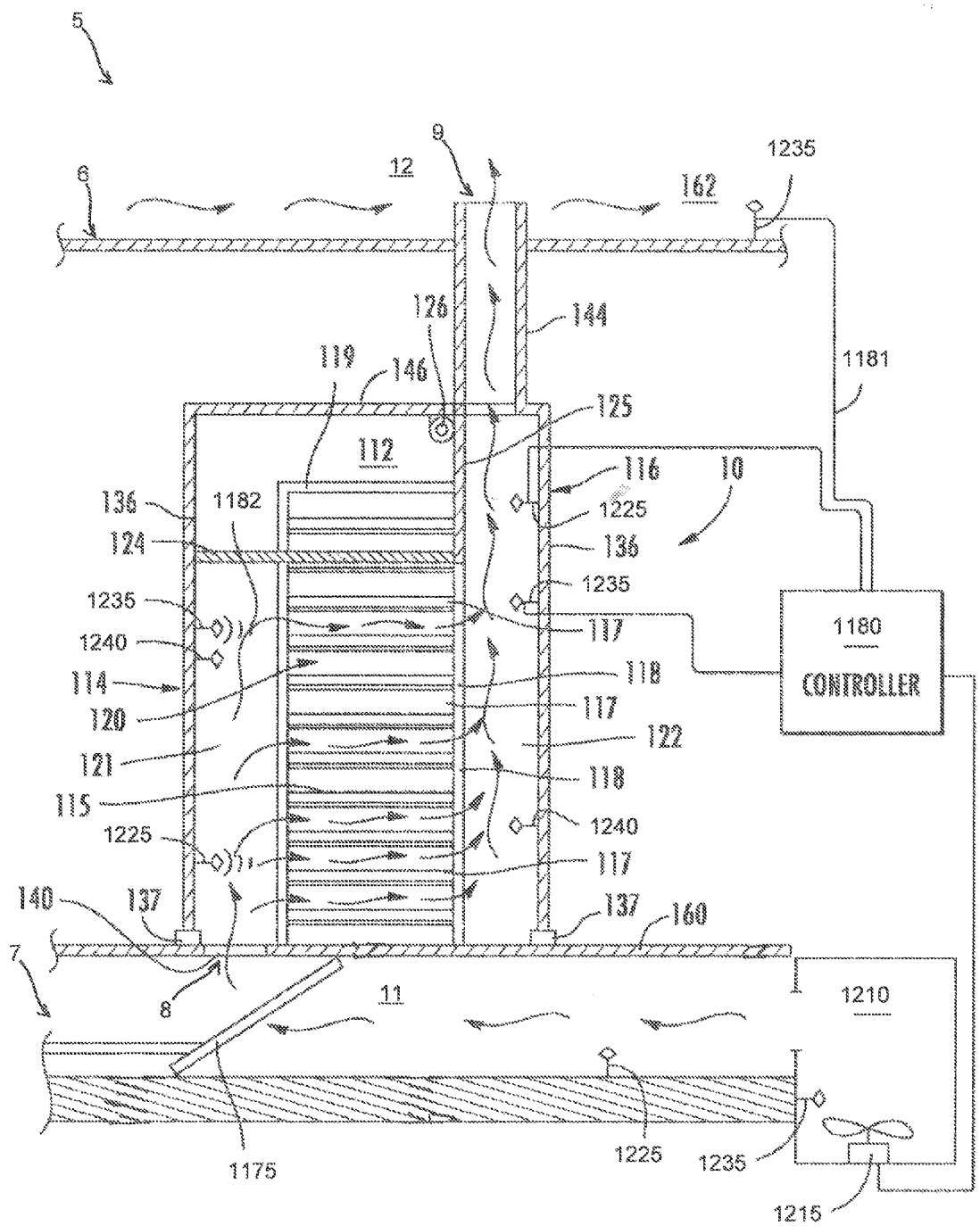
FIG. 2 is a plan schematic view of a thermal management system for cabinets housing electronic equipment according to arrangements of the present invention.
Figure 3:
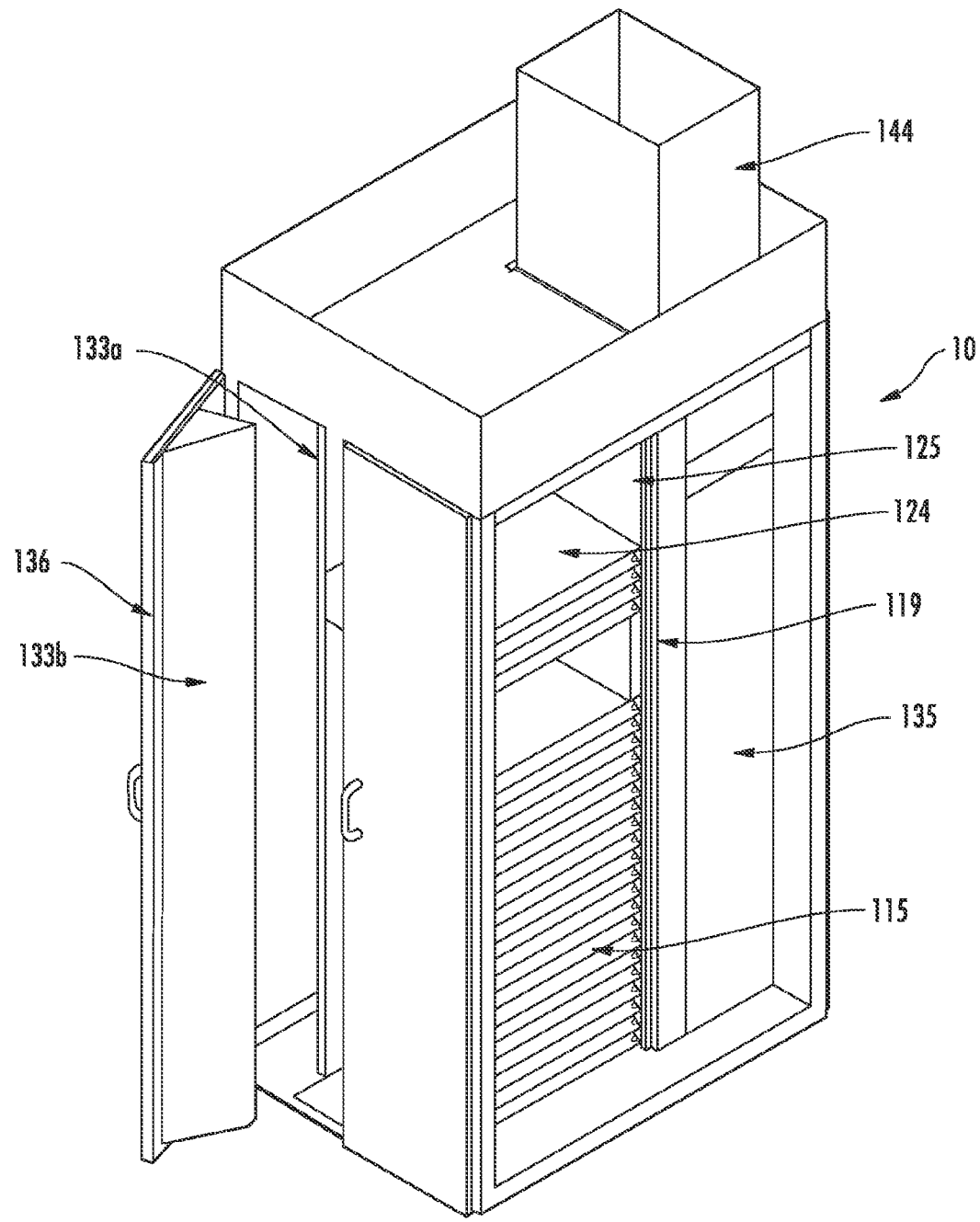
FIG. 3 is a perspective isometric view of the thermal management cabinet of FIG. 2 with side panels removed.
Figure 4:
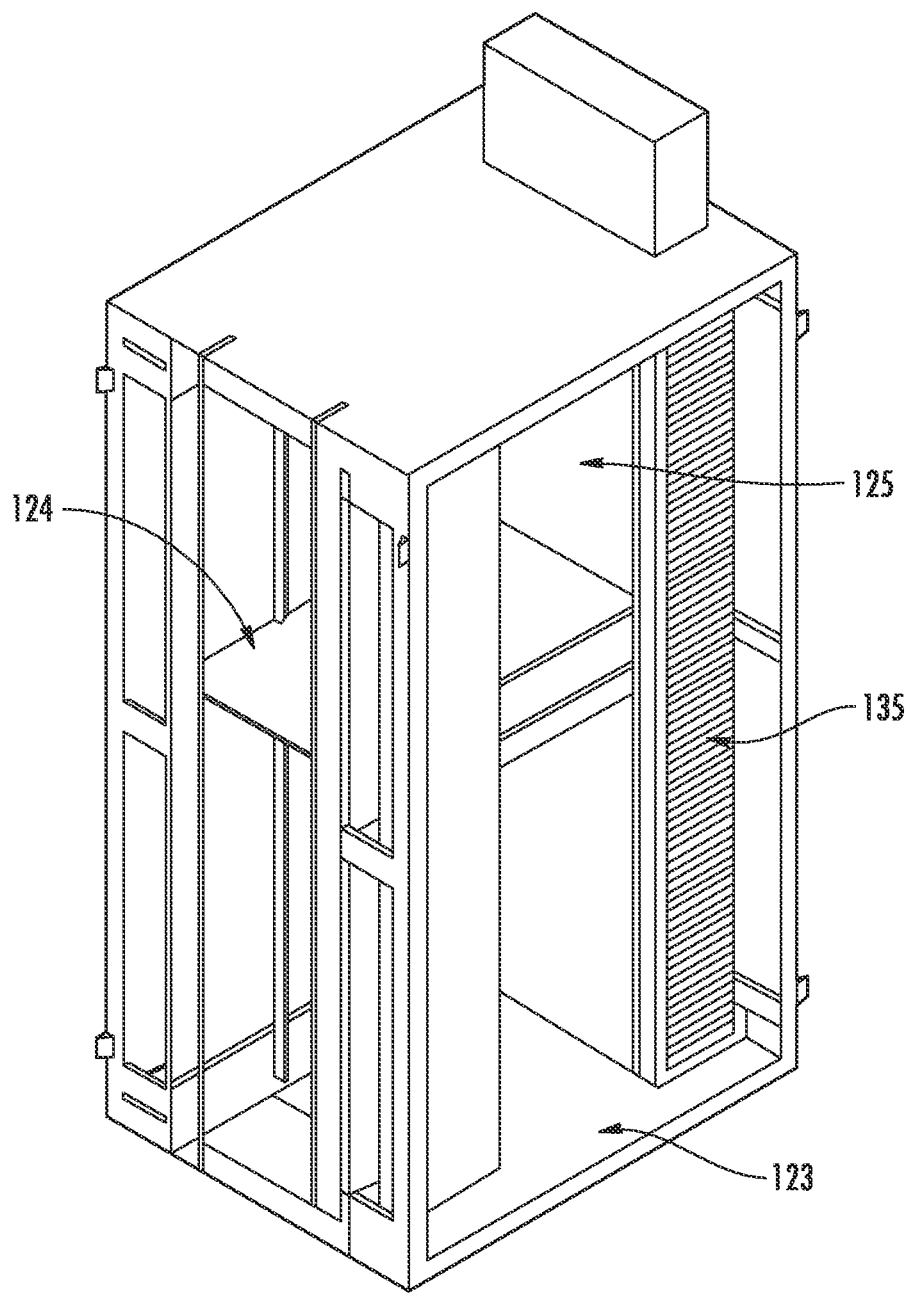
FIG. 4 is a perspective isometric view of the thermal management cabinet of FIG. 2 with doors and baffles removed.
Figure 5:
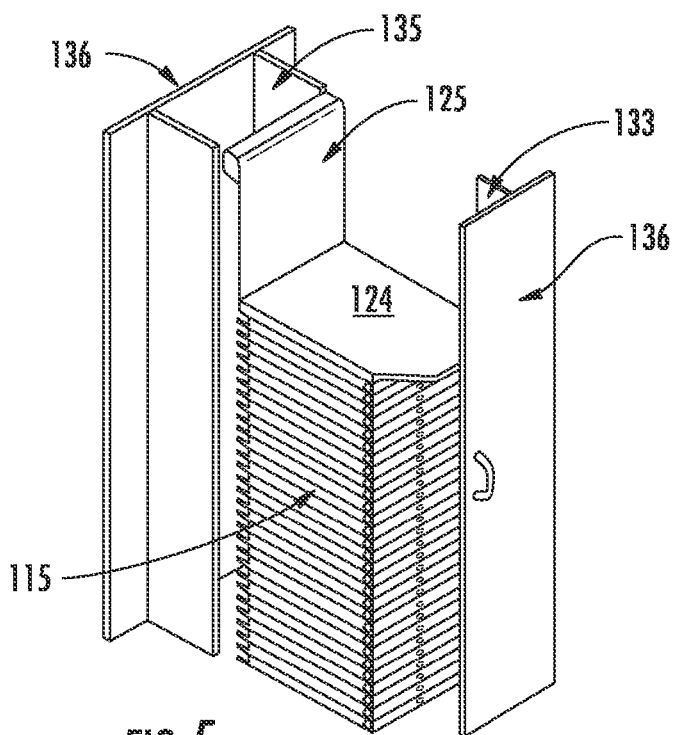
FIG. 5 is a side view of the thermal management cabinet of FIG. 2.
Figure 6:
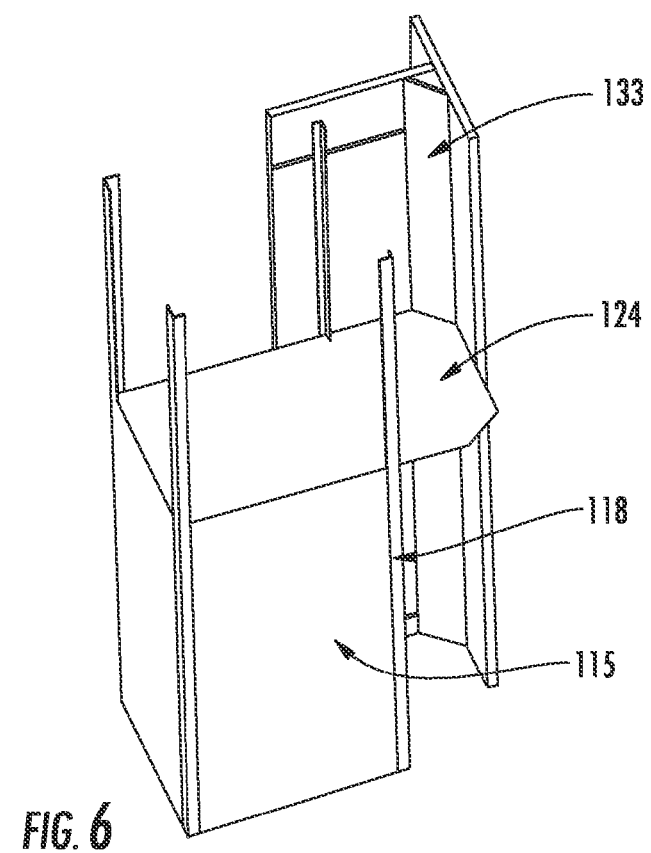
FIG. 6 is a perspective isometric view of the thermal management cabinet of FIG. 2, with servers removed.
Figure 7:
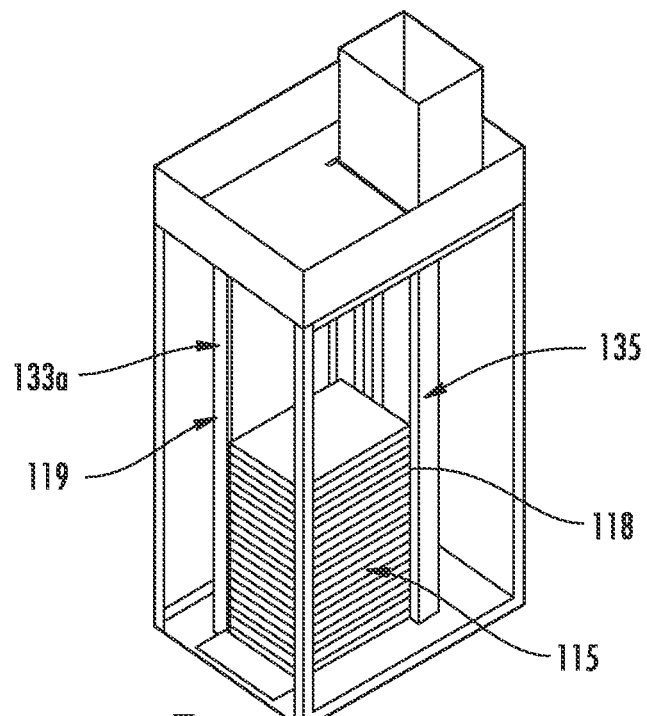
FIG. 7 is a perspective isometric view of the interior components of the thermal management cabinet of FIG. 2.
Figure 8:
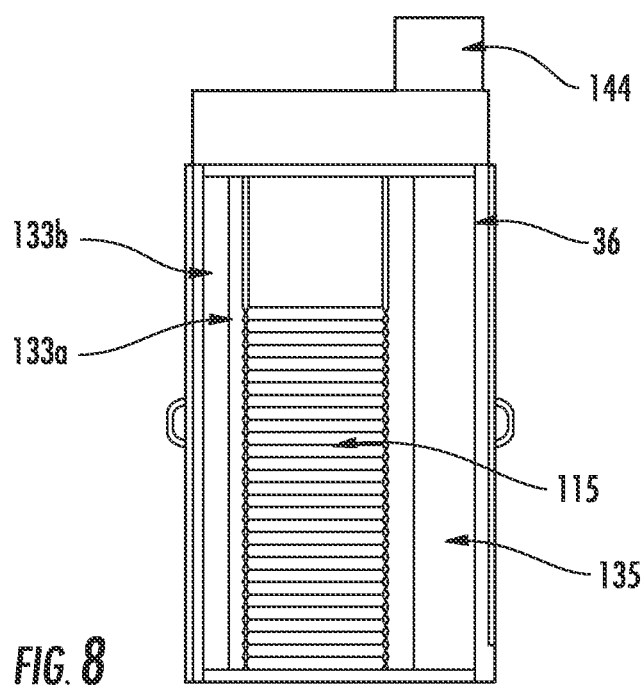
FIG. 8 is a side perspective view of the interior components of the thermal management cabinet of FIG. 2, showing the foam door seal.

In one embodiment shown in FIG. 2, the cabinets 10 can have generally solid side walls 112, a front 114 and a back 116. The cabinet 10 may be used to house a plurality of servers 15 or other pieces of electronic equipment, including routers, DSLAM's and so forth. Suitable dimensions for the cabinet 10 can vary depending on a number of factors including the type of electronic equipment, the facility space available, and the thermal management resources (e.g., the insulation factors, cooling power and so forth) but can include a height of 7 feet, a width of 3 feet and a depth of 4 feet. Referring to FIGS. 1A-1L and as discussed above, the cabinets 10 depicted in FIG. 2, as well as FIGS. 3-15, may be housed in the system 5. As such, FIG. 2 is a partial depiction of system 5 that shows the portion associated with cabinet 10. In various exemplary embodiments, the portion depicted in FIG. 2 may be generally referenced as a module or housing 6. As discussed below, the cabinet 10 may be considered to have an inlet 8 and an outlet 9, and the system 5 may include a cooling system 7 that delivers air to the inlet 8 via a supply channel 11, and the air then flows through the cabinet 10 and through the outlet 9 to an exhaust channel 12.

Referring additionally to FIGS. 3-8, the cabinet 10 may include generally L-shaped horizontal rails 117 attached to, and supported by, four vertical rail supports 118 which form part of a frame 119 that is positioned in the interior of the cabinet 10. A plurality of rails 117 may be provided in pairs to form shelving brackets on which electronic components can be supported. The rails may have any suitable formation, one suitable formation being standard square hole rails that may be positioned 19" apart to form a 19" rack. The rails may be mounted to the vertical rail supports 118 and define the depth of the racks for housing the electronic components 15.

The vertical rail supports 118 and the rails 117 can define an electronic component storage area 120 that is located within the frame 119. The positioning of the frame 119 can define a front service area 121 forward of the frame to the front 114 of the cabinet, a rear service area 122 rearward of the frame to the back 116 of the cabinet 10. Two side service areas 123 can be defined to the sides of the frame 119. The cabinet 10 can be designed to be 42 U in height, with "U," or rack unit, being a unit of measure used to describe the height of equipment intended for mounting in a 19-inch rack or a 23-inch rack (the dimension referring to the width of rack). One rack unit can be 1.75" (44.45 mm) high. Thus, a suitable number of rails 117 can be provided to equal the desired height of the cabinet, with the rails being spaced a suitable number of rack units apart.

An insulated thermal management plate 124 can be provided, which can be moved within the cabinet 10. The thermal management plate 124 can be formed of any suitable material. In one arrangement, the plate 124 can be formed of ABS plastic with a foam insulation backing. The thermal management plate 124 can extend from the front 114 of the cabinet 10 towards the back 116, typically to the rear vertical rail support 118 which marks the front end of the rear service area 122. The electronic components to be housed within the cabinet 10 can be stored within the cabinet, such as starting from the lowest rack and working upwards. The thermal management plate 124 is easily movable within the cabinet and is typically placed within the cabinet 10 just above the height of the highest electronic component that is stored within the cabinet 10. The plate 124 may be attached to the rails 117 that are positioned directly above the top-most electronic component, or may simply be rested thereon. At the front edge of the thermal management plate 124, the corners may be chamfered or cut off.

An insulated thermal curtain 125 can be provided at the back 116 of the cabinet 10. The thermal curtain 125 is preferably made of a composite material, though can be formed of any suitable material. The curtain 125 can be suspended from a deployment device 126, such as a spring loaded or ratcheted roller mechanism that is attached at the top of the frame 119. The curtain 125 can either be mounted within or adjacent to the rear rail supports 118 such that it is located at the edge of the rear service area 122. A bottom bracket 128 can enable the curtain 25 to be easily raised and lowered. Typically, the curtain is lowered until it is level with the thermal management plate 124. The curtain 125 can be formed of a thermal insulating material that prevents heat transfer. U-markings 130 may be provided on the curtain at 1.75" intervals, along with a company logo for the cabinet manufacturer. With a 19" rack width, the curtain 25 can be 20" wide.

The curtain 125 can run in, or otherwise be guided by, vertical U-shaped rails attached to the vertical rail supports 118 such that the curtain provides a generally sealed barrier to the transport of air. It should be appreciated, that although the arrangement illustrated has curtain 125 provided at the back 116 of the cabinet 10, it may alternatively or in addition be provided at the sides of the cabinet, and/or at only one of the front, back or sides of the cabinet. In other arrangements, the thermal curtain 125 can be positioned at the front of the cabinet 10.

The thermal management plate 124 and the thermal curtain 125 can be used to separate the interior space of the cabinet 10 into different zones by forming baffles to the air flow and heat transfer. A cold zone can be defined within the front service area 121, bounded at the rear by the electronic components that are stored within the racks and at the top by the thermal management plate 124. The front door, the sides 112 and the bottom of the cabinet 10 can form the other boundaries of the cold zone. A hot zone can be defined within the rear service area 122, bounded at the front by the electronic components that are stored within the racks and by the thermal curtain 125 that extends from the top of the cabinet 10 to the thermal management plate 124. The sides 112, the rear door, the bottom and the top of the cabinet 10 can form the other boundaries of the hot zone. A neutral heat zone can be formed above the cold zone, defined between the top of the cabinet 10, the thermal management plate 124, the sides 112 of the cabinet, the front door of the cabinet 10 and the thermal curtain 125. Thus, the hot zone typically forms the entire volume of the rear service area 122, while the front service area 121 and the electronic component storage area 120 can be split vertically by the horizontally-oriented plate 124 into the neutral heat zone at the top and the cold zone at the bottom.

In one embodiment air flow within the cabinet 10 can go first from the cold zone rearwardly through the electronic component storage area 120 where it becomes heated due to contact with the electronic components therein and exits into the hot zone. The air can then flow vertically upwards within the hot zone to exit the cabinet. The neutral zone is designed to be cut off from this air flow by the thermal management plate 124 and the thermal curtain 125. The neutral zone formed above the thermal management plate 124 can be used for storage for equipment such as laptops or other devices.

In other arrangements, a thermal curtain 125 may be provided without provision of a thermal management plate 124, in which case the thermal curtain may be positioned to either the front or back of the storage area 120, or at any location there between such as at the center thereof. The thermal curtain 125 can be mounted to the top of the cabinet, and can be simply extended downwardly until it reaches the top-most electronic component stored in the storage area 120. This arrangement thus splits the interior of the cabinet 10 into a hot zone and a cold zone by vertically dividing the space using the thermal curtain 125.

Figure 9:
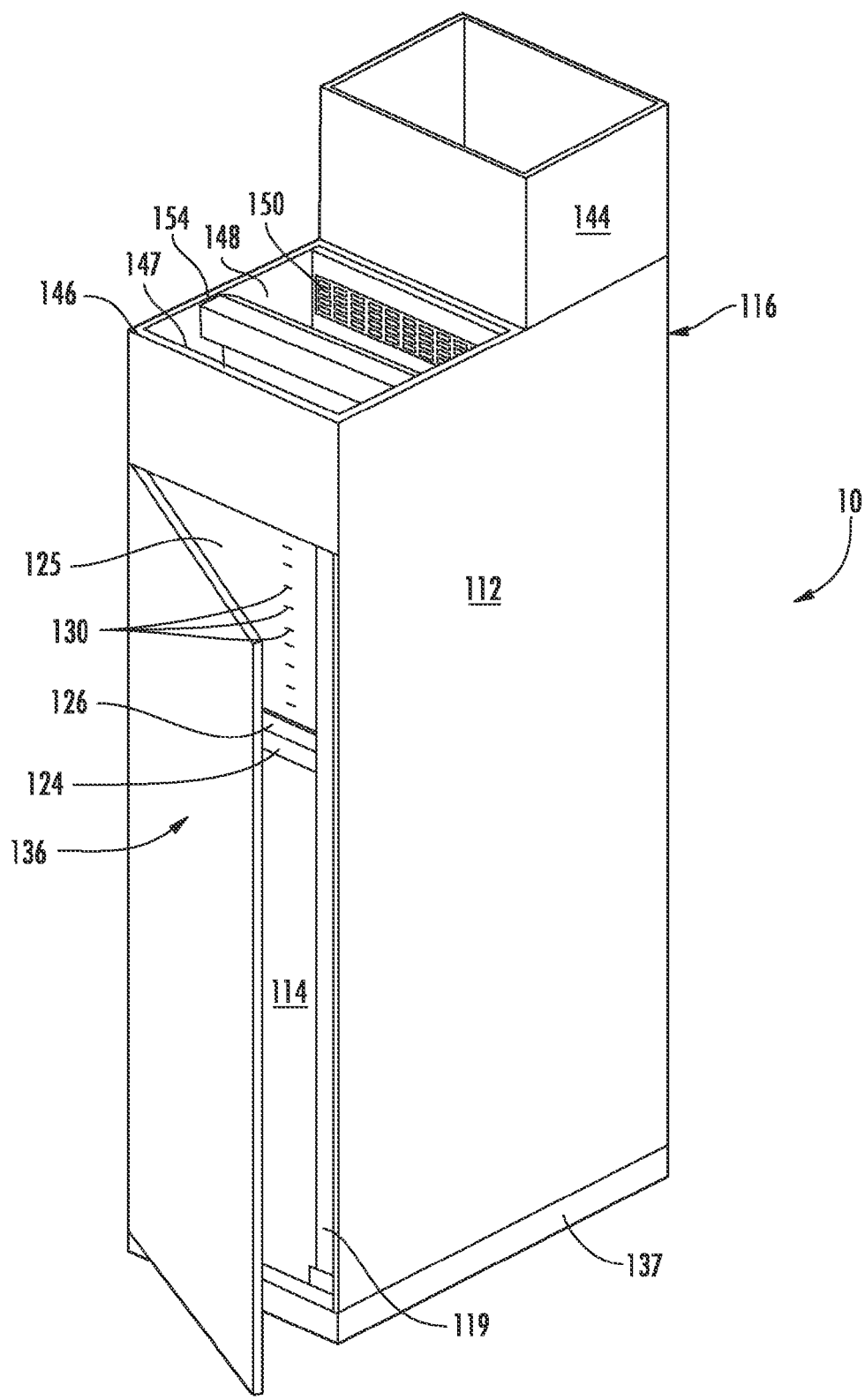
FIG. 9 is a side sectional view of the thermal management cabinet of FIG. 2, showing example airflow patterns.
Figure 10:
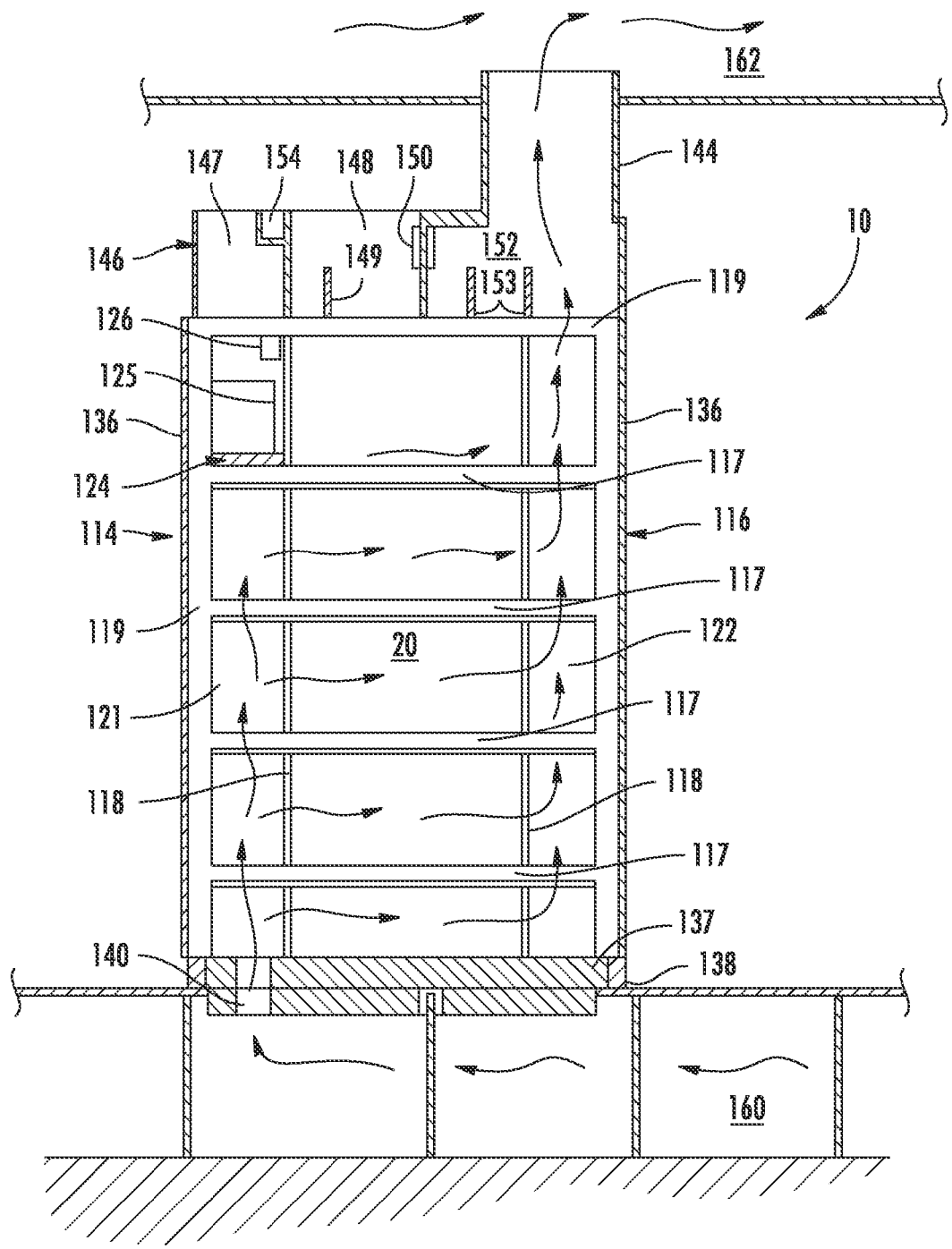
FIG. 10 is a front perspective view of another exemplary arrangement of thermal management cabinet according to the invention.

In yet other arrangements, as shown in FIGS. 9 and 10, the thermal management plate 124 can extend from the front 114 of the cabinet to the front vertical rail supports 118, and the thermal curtain 125 can be provided close to the front vertical rail supports. This creates a smaller neutral heat zone but still performs the function of preventing the cold zone from extending the full height of the cabinet 10 when the electronic components are not necessarily stacked up to the top of the cabinet 10.

Figure 11:
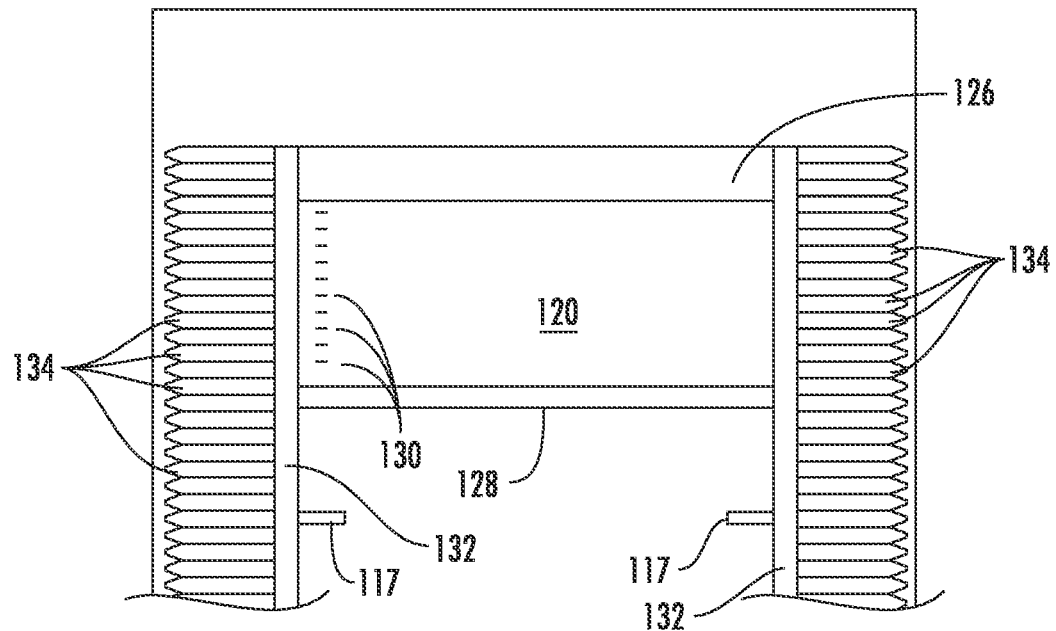
FIG. 11 is a view showing the flexible fingers used in the thermal management cabinet of FIG. 2.
Figure 12:
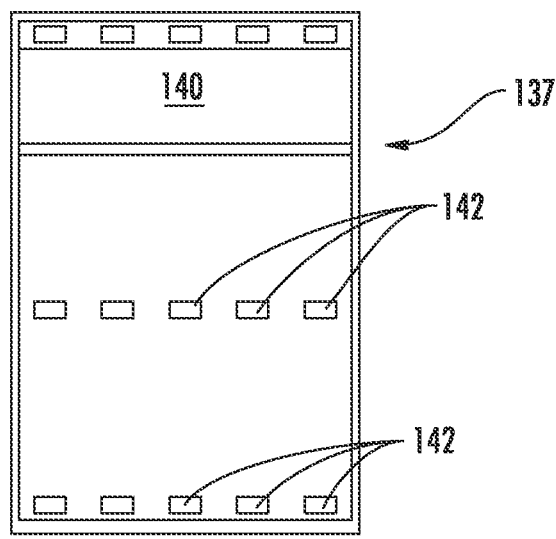
FIG. 12 is a bottom view of a modular base for the thermal management cabinet of FIG. 2.

Referring additionally to FIGS. 11 and 12, adjacent to the vertical rail supports 118 at the front 114 and back 116 of the cabinet 10, a plurality of air management fingers 134 and/or brushes 135 can be provided, which can extend to the sides or front/back of the cabinet 10. The fingers can be formed of a non-thermally conductive flexible material, such as a foam, rubber or plastic material. The fingers 134 can be generally rectangularly shaped and can be attached at one end only to a support which is attached the rail supports 118. Each finger can be separately moveable, and can allow cables to be passed therethrough by pushing the cables in between adjacent fingers 134. The brushes 135 can be similarly arranged, attached at one end only to the rail supports 118. In another embodiment, the brushes 135 can be provided on supports on either side of the gap between the rail supports 118 and the sides/front/back of the cabinet such that the brushes meet in the middle.

In one arrangement, a set of fingers 134 can extend from the rail supports 118 to the sides 112 of the cabinet at the rear edge of the front service space 121. A set of brushes 135 can extend from the rail supports 118 to the rear 116 of the cabinet 112. The side service areas 123 can thus be defined by the fingers 134 and brushes 135, such that they are bounded at the front by the fingers 134, at the sides by the sides 112 of the cabinet at the sides of the electronic components stored in the storage area 120 and the brushes 135, and at the rear by the rear 116 of the cabinet. The side service areas 123 can thus be generally separated from the airflow in the cabinet by the fingers 134 and/or brushes 135, which form baffles, and the side service areas 123 thus form secondary neutral heat zones. It will of course be appreciated that any arrangement of brushes and/or fingers can be employed to both provide a separation of the air flow from the side service areas 123 and still to allow cables to be threaded into and through the side service areas 123 for appropriate cable management purposes.

In another arrangement, in place of or in addition to fingers 134 and/or brushes 135, flexible foam insulation pieces 133 can be used. The foam pieces may be provided in two parts: a generally thin rectangular piece 133*a* may be extended vertically from the cut corners of the thermal management plate 124, and a generally triangular-section piece 133*b* may be attached to a door 136 of the cabinet. When the door 136 is closed, the two foam pieces 133*a* and 133*b* can abut one another. Cables can then be run from the electronic components stored on the rack through the abutting foam pieces 133*a*, 133*b*, to the side service areas 123. The foam insulation pieces 133 can thus form baffles between the cold zone and the neutral heat zone of the side service areas 123.

The sides 112 may each include one or more removable side panels to allow access between cabinets. The sides 112 and side panels may be constructed of lightweight composite materials with non-thermal conductive properties. Insulation may also be provided on the side panels. In some arrangements, the sides 112 may include one or more punch out panels so that cables may be run from servers stored in one cabinet 10 to servers stored in another cabinet 10. As the side service areas 123 are generally neutral air zones, it does not affect the cooling capabilities of the cabinet airflow to provide punch out holes in the sides.

The back 116 and the front 114 may both include one or more doors 136. The door 136 may have a side hinge, and may be constructed of lightweight composite materials similar to the sides 112, and may also be insulated. In one embodiment, a double door may be provided, which has the advantage of allowing a decrease in necessary aisle space between cabinets that face one another. The door may include a temperature sensor that may be viewed without opening the door. The temperature sensor may be provided behind a window in the door, or may have a sensor part mounted inside the cabinet and a display part mounted on the outside of the door. The door may include a combination lock, or other locking mechanism. A rubber or other seal (not shown) may be provided around the doors 136, to help to seal any air gaps that might be created.

In one embodiment, the cabinet 10 may be mounted on a modular base 137, fanning a bottom 138 of the cabinet. The base may measure 3' wide by 4' long, and may allow access to a raised floor system 160 such as a TATE 24"×24" modular access floor system. A front section 140 of the base 137 is open to the subfloor, and registers with corresponding openings that are created to the raised floor system. A plurality of feet 142 are provided to bear the weight of the cabinet. A skirt (not shown) may surround the feet to prevent cool air from exiting around the base 137.

An airflow duct or chimney 144 may extend from a top 146 of the cabinet 10. The duct 144 can extend generally from an area of the top 146 that is adjacent to the back 116 of the cabinet. The duct 144 is dimensioned to extend into a ceiling space 162 such as an above-ceiling plenum for venting hot air to a venting means (not shown). The duct 144 may be flexible so that it can be easily connected to the ceiling even in the event of imperfect positioning of the cabinet 10 below a vent panel into the ceiling space 162. In one arrangement, the duct 144 can be formed of a flexible fabric or plastic material. In another embodiment, the duct 144 can be formed of a rigid material. The ceiling space 162 may be a standard drop ceiling system. Various components can be provided in the top 146 such as a power raceway 147 and a public communications raceway 148, both of which may be open to the room.

A divider 149 may divide the public communications raceway 148 for fiber and copper cables. A patch panel 150 can extend from the public communications raceway into a private communications raceway 152 for pass through of cables into the interior of the cabinet 10. Dividers 153 may be included in the private communications raceway 152 for dividing the space for fiber and copper cables. Junction boxes 154 may be provided in the power raceway 148a for supply of power to the power circuit in the cabinet. Power strips 156 and cable managers 158 may be provided adjacent the back 116 of the cabinet 10. It will be appreciated that the arrangement of components at the top 146 of the cabinet 10 can be varied to suit the particular application.

In use, the cabinet 10 can be installed over a raised access floor 160 that is provided with cooled air from an HVAC or other system. The base 137 can be registered with openings in the floor 160. The chimney can be extended into a drop ceiling 162. The electronic components can be installed on rails 117, and are appropriately cabled by passing cables through the foam pieces 133, fingers 134 and/or brushes 135 into the side service areas 123. Standard cable management ladders may be employed in the side service areas 123 to hold the cables at the right height and to allow them to be passed to the tops of the cabinet. The cables are run to the top of the cabinet 10 for connection to the power supply and to communications cables, which may be connected to other servers using standard overhead ladder racks. The doors 136 are then closed.

As the electronic components are operated, they generate heat which is forced to the rear service area 122 by the airflow coming into the cold zone of the front service area 121 of the cabinet via the aperture 140 at the front of the cabinet. The hot zone created in the rear service area 122 due to the heating effect of the electronic components causes the air to flow up through the duct 144. The air thus circulates from the cold zone, through the electronic components in the storage area 120 to the hot zone and up into duct 144. The various baffles such as the thermal management plate 124, thermal curtain 125 and foam pieces 133, fingers 134 and/or brushes 135 constrain the airflow into the smallest possible space within the cabinet, and prevent hot and cold air mixing other than through the electronic component storage area 120.

Figure 13:
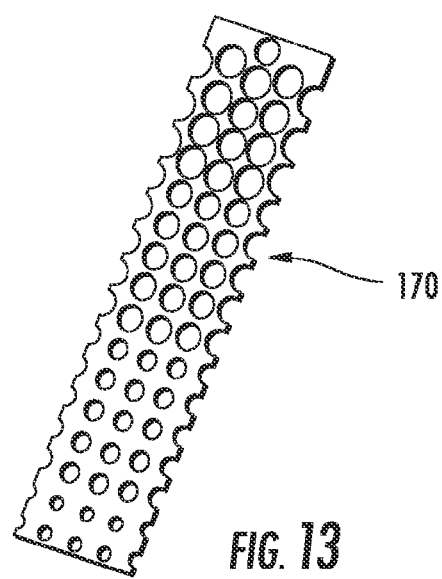
FIG. 13 shows an exemplary embodiment of a perforated curtain for use in the thermal management cabinet according to the present invention.
Figure 14:
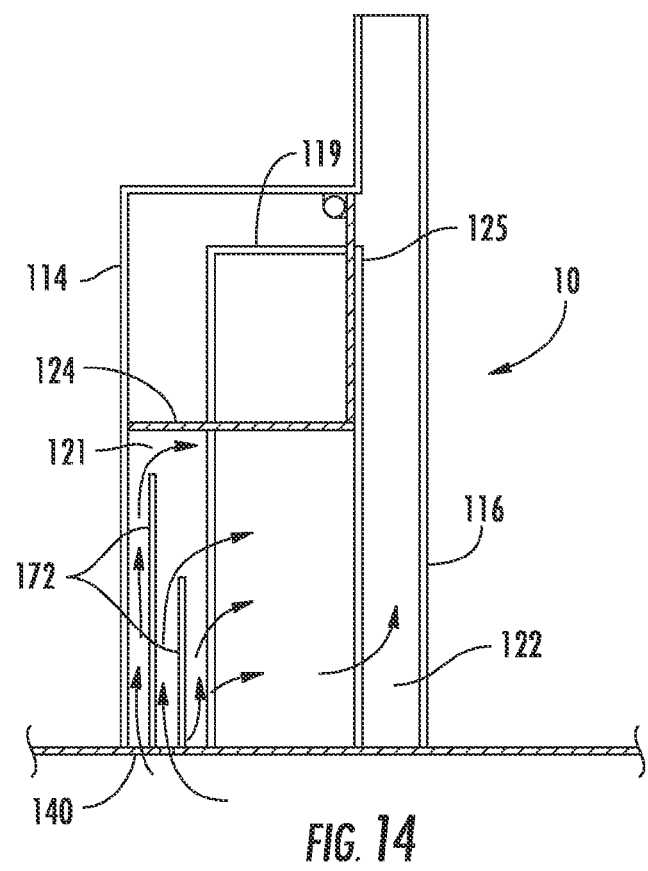
FIG. 14 is a side view showing an exemplary embodiment of airflow plates for use in the thermal management cabinet according to the present invention.

In order to ensure that sufficient cool air is delivered to the upper most electronic components, one or more flow diverters can optionally be used. For example, a perforated curtain 170 as shown in FIG. 13 or a series of plates 172 as shown in FIG. 14, may be used. Such arrangements can help to keep cool air flowing towards the top servers rather than allowing it all to be directed to the lower servers.

In one exemplary embodiment, the cabinet enclosure can have an inlet and an outlet in proximity to a bottom portion of the cabinet enclosure. A supply channel can be connected with the cabinet enclosure inlet. The cabinet enclosure can be positioned on a floor and the supply channel can be under the floor. An exhaust channel can be connected with the cabinet enclosure outlet. One or more plenums can be in fluid communication with at least one of the supply and exhaust channels. The plenums can have a pressure source for generating a pressure differential through the enclosure of the cabinet enclosure causing air to flow therethrough. A cooling coil can be positioned under the floor and in thermal contact with the supply channel. A coolant can flow through the cooling coil to remove heat from the air flowing through the supply channel.

In another exemplary embodiment, a thermal management cabinet for electronic equipment can include a cabinet frame having side walls and defining a front, a back, a top and a bottom, where the cabinet forms a generally sealed enclosure for electronic equipment. An electronic component storage area including at least one shelving rack for supporting electronic equipment can be defined in an interior section of the cabinet. At least one opening can be included in the top of the cabinet, and at least one opening can be included in the bottom of the cabinet. The cabinet can be dimensioned to extend between a raised access floor of a building and a drop ceiling of a building, where the access floor carries cooled air and the drop ceiling venting heated air. The bottom opening of the cabinet can be alignable with an opening in the access floor such that cool air from the access floor passes into the cabinet and flows through the electronic component storage area to exit the cabinet through the top opening, which is alignable with an opening in the drop ceiling.

The cabinet interior can be separated into temperature zones comprising at least a cold zone supplied with air from the bottom opening of the cabinet and a hot zone for venting through the top opening, with at least one baffle provided to create the temperature zones such that air is directed to flow from the cold zone through the electronic component storage area to the hot zone. In one arrangement, the baffle can comprise a thermal management plate that is positioned horizontally in the cabinet above the electronic component storage area. The thermal management plate can be formed of insulated material such as a plastic material backed with an insulator.

In another arrangement, the baffle can comprise a heat transfer curtain that is positioned vertically in the cabinet above the electronic component storage area. The heat transfer curtain can be formed of a composite material. In yet another arrangement, the baffle can be flexible and can allow cables to be passed through areas of the cabinet while providing a heat transfer barrier. The flexible baffle can comprise at least one of flexible fingers, foam insulation and brushes. The flexible fingers and brushes can extend from the electronic component storage area to at least one of the side walls, front and back of the cabinet. The at least one foam insulation can comprise two flexible foam pieces positioned to allow cables to be passed therebetween.

In another embodiment, a duct can extend from the top opening of the cabinet for connection to a drop ceiling. The duct can be formed of a flexible material such as a fabric material. At least one door can be provided in at least one of the front and back of the cabinet. The at least one door can be a double door. Insulation pieces can be provided adjacent at least one hinged edge of the at least one door. The insulation pieces can form a flexible baffle, and can comprise two flexible foam pieces positioned to allow cables to be passed therebetween. At least one side of the cabinet can include a removable panel. At least one punch hole having a removable plug can be provided in at least one side of the cabinet. At least one airflow management structure can be provided adjacent to the bottom opening of the cabinet, which may be a perforated curtain.

Figure 15:
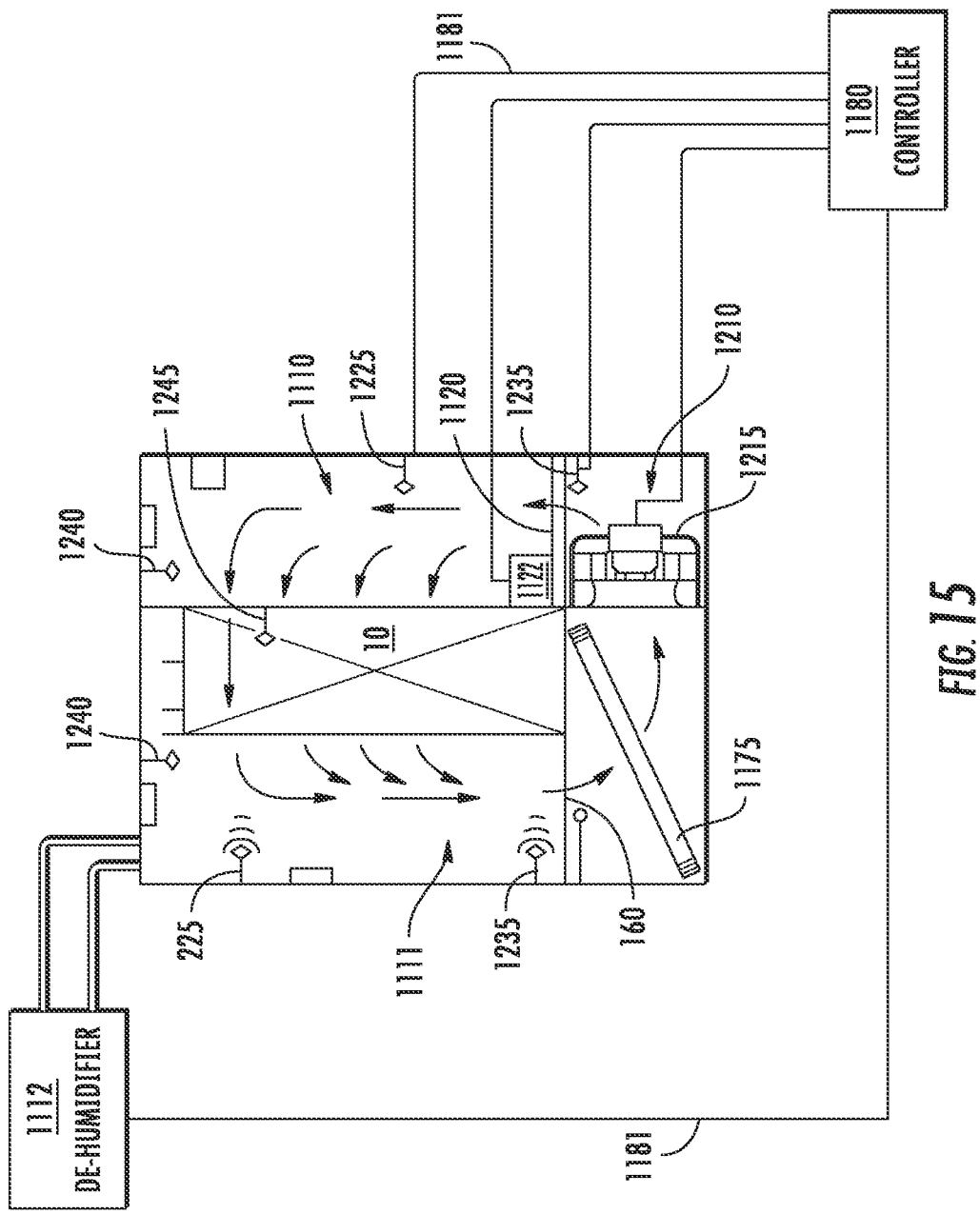
FIG. 15 is a schematic illustration of another exemplary arrangement of thermal management cabinet according to the invention.

In one embodiment as shown more clearly in FIG. 15, the cabinets 10 can be in fluid communication with a pressurized plenum 1210. The particular number of plenums 1210 used can vary. For example, the system 5 can utilize a single plenum 1210 so that the pressure differential is centrally generated. In another example, multiple pressurized plenums 1210 can be utilized, such as one or more plenums being utilized for each row. The plenum 1210 can have one or more pressure sources, such as fan 1215, although other pressure sources are also contemplated including pumps and the like.

In one embodiment, the fan 1215 can be a centrifugal fan. The fan 1215 can include noise-absorption components and anti-vibration mounting components. Various filters and other components can be utilized in combination with the fan. In one embodiment, the fan 1215 can be an adjustable speed fan to increase or decrease the pressure in the plenum 1210. For example, the fan 1215 can be a variable frequency drive fan. In another embodiment, a plurality of fans 1215 can be in communication with the pressurized plenum 1210 so that the pressure can be increased by operating additional fans of the plurality of fans. The present disclosure also contemplates the fan configuration being modular. For instance, the fans 1215 can be easily added to the plenums, such as by removing a blocking plate that seals a wall of the plenum in the absence of the fan.

The cabinets 10 can be bound on a first side by a cold zone 1110 and bound on a second side by a hot zone 1111. In the exemplary embodiment shown, the cold and hot zones 1110 and 1111 are access areas that have doors 1105 so that technicians can access the cabinets when needed (such as for adding or removing the electronic equipment). However, the present disclosure also contemplates the cold and hot zones 1110, 1111 being integrally formed with the cabinets 10 and/or defined by an insulated false wall between the access areas and the cabinets. In the exemplary embodiment of FIG. 15, each cabinet in a row share a cold zone 1110 and a hot zone 1111. However, the present disclosure contemplates other configurations of cold and hot zones 1110, 1111, such as individual cabinets or groups of cabinets in a single row having their own cold and hot zones. Adjacent hot and cold zones 1111, 1110 can be separated by a wall 1115.

The pressurized plenum 1210 can generate a pressure differential between the cold zone 1110 and the hot zone 1111 thereby causing air to flow across the electronic equipment in the cabinets 10 which removes heat from said equipment. The number and configuration of plenums that are utilized to generate the desired pressure differential can vary based on a number of factors, including the type of electronic equipment that is being environmentally managed. For example, a plurality of plenums 1210 can be in fluid communication with the cold and hot zones 1110, 1111 of each row. The pressurized plenums can generate positive pressure and/or negative pressure to create the desired pressure differential and thereby create air flow over the electronic equipment. For instance, a first pressurized plenum can generate a positive pressure (e.g., a desired pressure above ambient) in proximity to the cold zone 1110, while a second pressurized plenum generates a negative pressure (e.g., a vacuum) in proximity to the hot zone 1111.

In one embodiment, the use of pressurized plenums 1210 allows system 5 to isolate fans from the electronic equipment. For example, the pressurized plenums 1210 can increase air pressure using pumps so that the system does not utilize any fans. In another example, the pressure increase can result from the use of fans that are positioned remotely from the cabinets so that air flow from the fans does not directly contact the electronic equipment (e.g., the fans create air flow within the plenum that results in an increased pressure in the plenum which is in turn communicated to the cabinets).

The air passing over the electronic equipment is utilized to remove heat from the equipment. In turn, the cooling subsystem can then remove the heat from the air. In one embodiment, the cooling subsystem can be a vapor-compression cycle system, although other systems are also contemplated by the present disclosure. The subsystem can include a pump and one or more chillers for cooling water or other coolant (e.g., chilled liquid settings between 15 and 50 degrees Fahrenheit) which is then supplied to coils via supply lines and return lines. The coils 1175 can be positioned in thermal communication with the hot zone 1111. For example, the coil 1175 can be positioned under the floor 160 so that the air coming from hot zone 1111 passes through the coil 1175 then through the pressurized plenum 1210 and back into the cold zone 1111. The particular number and configuration of coils 1175 that are utilized can vary based on a number of factors, including the number of pressurized plenums and configuration of the cold and hot zones that are being utilized. For example, each row of cabinets 10 can have six equidistantly positioned pressurized plenums 1210 under the floor 160 with a coil 1175 in thermal communication with each of the plenums (e.g., positioned downstream of the hot zone 1111 and upstream of the cold zone 1110 for each plenum).

To control the environment surrounding the electronic equipment, a controller 1180 can be utilized. The controller can be a machine within which a set of instructions, when executed, may cause the machine to perform any one or more of the methodologies discussed herein. In some embodiments, the machine can operate as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment. The machine may comprise a server computer, a client user computer, a personal computer (PC), a tablet PC, a laptop computer, a desktop computer, a control system, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The controller 1180 can be in communication with one or more sensors for receiving environmental information associated with the electronic equipment. For example, one or more temperature sensors 1225 and one or more pressure sensors 1235 can be positioned with respect to the electronic equipment so that the sensors can capture environmental information and transmit the information to the controller 1180. The particular positioning of the sensors can vary. For instance, temperature sensors 1225 can be placed both upstream and downstream of the coil 1175 so that the cooling efficiency of the coil can be easily monitored, while other temperature sensors can be placed in close proximity to the electronic equipment so that the amount of heat being generated by the electronic equipment can be more easily monitored. The pressure sensors 1235 can be placed both upstream and downstream of the pressurized plenum 1210 so that the pressure differential can be more easily monitored. The type of sensor used to capture the environmental information can also vary, including pressure and temperature transducers and thermocouples.

In one embodiment, other sensors can also be used to further monitor the environmental conditions associated with the electronic equipment, such as humidity sensors 1240 and flow sensors 1245. The humidity sensors 1240 allow the controller 1180 to monitor the humidity that the electronic equipment is being exposed to and to adjust the humidity accordingly, such as through use of a de-humidifier 1112 that is in fluid communication with the electronic equipment. The flow sensors 1245 allow the controller 1180 to monitor the flow rate of air, such as for determining heat transfer via convection. The use of flow sensors 1245 can also be used for determining other environmental characteristics, such as air flow turbulence, that can have an adverse impact on the cooling of the electronic equipment or the equipment itself.

The sensors can communicate with the controller 1180 via hardwire (e.g., cables 1181) and/or wireless links 1182. The particular communication protocols that are utilized can vary and can include Wireless Fidelity or WiFi services, Bluetooth, GSM, CDMA, UMTS, WiMAX, and so forth. A combination of communication techniques can also be utilized, such as allowing the sensors to communicate both wirelessly and via hardwire to provide redundancy so that data is not lost in the event of a link failure.

The controller 1180 can receive the environmental information from the sensors and adjust the environmental conditions accordingly. In one embodiment, each of the cabinets 10 can have a range of environmental conditions that are acceptable. In real time, the controller 1180 can receive the environmental information associated with each of the cabinets 10 and then in real time can adjust one or more of the temperature, pressure and humidity associated with the cabinets.

For example, the controller 1180 can determine that a first cabinet 10 needs to lower its temperature by a desired amount. The controller 1180 can then transmit control signals for making the appropriate adjustment to achieve the desired temperature change. For instance, the controller 1180 can transmit a control signal to the cooling subsystem to increase coolant flow to the coil 1175 that is associated with the particular cabinet or to decrease the temperature of the coolant that is being provided to the coil. In one embodiment, the controller 1180 can transmit a control signal to the cooling subsystem which designated a desired temperature and the subsystem can then implement the necessary steps to achieve the desired temperature. As another example, the controller 1180 can transmit a control signal to the pressurized plenum that is associated with the particular cabinet so that the pressure differential is increased thereby increasing the air flow through the particular cabinet. In one embodiment, the controller 1180 can independently utilize the pressurized plenum 1210 and the cooling subsystem to adjust the temperature associated with a particular cabinet. In another embodiment, the controller 1180 can utilize both of the pressurized plenum 1210 and the cooling subsystem to adjust the temperature associated with a particular cabinet.

As another example, the controller 1180 can determine that a first cabinet 10 needs to decrease its air flow rate through the cabinet 10 a desired amount. The controller 1180 can then transmit control signals for making the appropriate adjustment to achieve the desired air flow rate. For instance, the controller 1180 can transmit a control signal to the pressure source 1215 of the pressurized plenum to decrease the pressure within the plenum that is associated with the particular cabinet. In one embodiment, a damper 1120 can be utilized for air flow control. For instance, the damper 1120 can be positioned downstream of the pressurized plenum 1210 and opened or closed using an actuator 1122 (e.g., a servo-motor or other movable control device). In this example, the controller 1180 can restrict air flow to the particular cabinet by sending control signals to the actuator 1122 which results in the damper moving towards a closed position.

Controller 1180 can also utilize historical information to provide environmental management for the cabinets 10. For example, the controller 1180 can monitor the temperature of particular cabinets based on particular times of the day and adjust the environmental conditions of the cabinets in anticipation of those temperatures. For instance, historical data may show that electronic equipment in a particular cabinet is typically being used to capacity during the morning with a resulting elevation of cabinet temperature during those morning hours. The controller 1180 can adjust the temperature in the particular cabinet to a lower portion of the desired range in anticipation of the increased temperature in the morning. The historical data can be maintained in a memory of the controller 1180 or can be stored elsewhere and retrieved by the controller.

Controller 1180 can also maintain historical information associated with the efficiency of the thermal control being implemented by the controller. For example, the controller 1180 can implement several different techniques for achieving a desired environmental condition and compare the techniques to determine which was the most efficient. For instance, where a temperature decrease is needed, the controller 1180 can on a first occasion utilize an increase in pressure differential to achieve the lower temperature. On a second occasion, the controller 1180 can utilize the cooling subsystem to achieve the lower temperature. The controller 1180 can then determine efficiency based on such factors as the amount of time needed to achieve the lower temperature, the amount of power utilized in achieving the lower temperature and so forth. In this example, the controller 1180 can then utilize this historical information to determine which thermal management techniques should be utilized in the future based on the particular circumstances.

In one embodiment, other factors can also be analyzed by the controller 1180 for determining the particular technique to utilize to achieve the desired environmental condition. For instance, vibration or noise can be monitored with respect to the use of certain components of the system 5 and the amount of vibration or noise can be a factor in determining which technique (e.g., which cooling components) should be utilized.

The methodology and techniques described with respect to the exemplary embodiments can be performed using a machine or other computing device within which a set of instructions, when executed, may cause the machine to perform any one or more of the methodologies discussed above. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment. The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The machine may include a processor (e.g., a central processing unit (CPU), a graphics processing unit (GPU, or both), a main memory and a static memory, which communicate with each other via a bus. The machine may further include a video display unit (e.g., a liquid crystal display (LCD), a flat panel, a solid state display, or a cathode ray tube (CRT)). The machine may include an input device (e.g., a keyboard), a cursor control device (e.g., a mouse), a disk drive unit, a signal generation device (e.g., a speaker or remote control) and a network interface device.

The disk drive unit may include a machine-readable medium on which is stored one or more sets of instructions (e.g., software) embodying any one or more of the methodologies or functions described herein, including those methods illustrated above. The instructions may also reside, completely or at least primarily, within the main memory, the static memory, and/or within the processor during execution thereof by the machine. The main memory and the processor also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions, or that which receives and executes instructions from a propagated signal so that a device connected to a network environment can send or receive voice, video or data, and to communicate over the network using the instructions. The instructions may further be transmitted or received over a network via the network interface device.

While the machine-readable medium is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure.

The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; or other self-contained information archive or set of archives is considered a distribution medium equivalent to a tangible storage medium. Accordingly, the disclosure is considered to include any one or more of a machine-readable medium or a distribution medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDPIIP, HTML, HTTP) represent examples of the state of the art. Such standards are periodically superseded by faster or more efficient equivalents having essentially the same functions. Accordingly, replacement standards and protocols having the same functions are considered equivalents.

The illustrations of arrangements described herein are intended to provide a general understanding of the structure of various embodiments, and they are not intended to serve as a complete description of all the elements and features of apparatus and systems that might make use of the structures described herein. Many other arrangements will be apparent to those of skill in the art upon reviewing the above description. Other arrangements may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Thus, although specific arrangements have been illustrated and described herein, it should be appreciated that any arrangement calculated to achieve the same purpose may be substituted for the specific arrangement shown. This disclosure is intended to cover any and all adaptations or variations of various embodiments and arrangements of the invention. Combinations of the above arrangements, and other arrangements not specifically described herein, will be apparent to those of skill in the art upon reviewing the above description. Therefore, it is intended that the disclosure not be limited to the particular arrangements(s) disclosed as the best mode contemplated for carrying out this invention, but that the invention will include all embodiments and arrangements falling within the scope of the appended claims.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims.

The invention claimed is:

1. A modular data center system comprising:
   a module for housing removable electronic equipment, the module connected directly to a utility power grid;
   a cooling system in fluid communication with an inner volume of the module for cooling of the electronic equipment;
   wherein the data center system is capable of being moved to remote locations;
   a cabinet within the module that forms an enclosure, wherein the cabinet has an inlet and an outlet;
   a supply channel connected with the cabinet inlet;
   an exhaust channel connected with the cabinet outlet;
   a sensor in proximity to the cabinets for sensing environmental data associated with the electronic equipment;
   a controller coupled to the module and the sensor, the controller receiving the environmental data from the sensor and causing an adjustment to an environmental condition associated with the module; and
   a data center control system in communication with at least one of the controller and the sensor, the data control system configured to collect data associated with the modular data center system.

2. The data center system of claim 1, wherein the environmental condition is at least one of a temperature, a pressure, a humidity and a security control associated with the electronic equipment.

3. The data center system of claim 1, wherein the cooling system is at least partially housed by the module.

4. The data center system of claim 1, wherein the inlet is in proximity to a bottom portion of the cabinet, and wherein the outlet is in proximity to a top portion of the cabinet.

5. The data center system of claim 1, wherein the cabinet is positioned on a floor in the module and the supply channel is under the floor.

6. The data center system of claim 5, wherein the cooling system comprises a cooling coil and the cooling coil is positioned under the floor and in thermal contact with the supply channel.

7. The data center system of claim 1, wherein the cooling system comprises a cooling coil and a coolant flows through the cooling coil to remove heat from the air flowing through the supply channel.

8. The data center system of claim 1, further comprising one or more plenums in fluid communication with at least one of the supply channel and the exhaust channel to cause air to flow through the enclosure.

9. The data center system of claim 1 wherein the controller causes the adjustment in real time.

10. The data center system of claim 1, further comprising a damper connected with the supply channel, wherein the damper has a damper actuator connected thereto, and wherein the damper can be opened and closed based on signals transmitted from the controller to the damper actuator.

11. The data center system of claim 1, further comprising a mobile support structure, wherein the module is disposed on the mobile support structure and the mobile support structure comprises a trailer capable of being towed to the remote location.

12. The data center system of claim 1, wherein the sensor is a first sensor positioned in the supply channel.

13. The data center system of claim 12, wherein the cabinet has a front area forming a cold zone and a rear area forming a hot zone, and wherein the data center system further comprises a second sensor positioned in the front area and a third sensor positioned in the rear area.

14. The data center system of claim 1, wherein the cabinet has a ceiling, a floor, and a horizontal thermal management plate positioned between the ceiling and the electronic equipment.

15. The data center system of claim 14, further comprising a retractable thermal curtain extending in a vertical direction between the ceiling and the thermal management plate.

16. The data center system of claim 14, further comprising a fan arranged below the floor of the cabinet and in fluid communication with the supply channel.

* * * * *